United States Patent
Gordon et al.

(10) Patent No.: US 8,987,031 B2
(45) Date of Patent: Mar. 24, 2015

(54) FABRICATING A SMALL-SCALE RADIATION DETECTOR

(71) Applicant: International Business Machines Corporation, Armonk, NY (US)

(72) Inventors: Michael S. Gordon, Yorktown Heights, NY (US); Christopher V. Jahnes, Upper Saddle River, NJ (US); Eric A. Joseph, White Plains, NY (US); Hiroyuki Miyazoe, White Plains, NY (US); Kenneth P. Rodbell, Sandy Hook, CT (US); Arun Sharma, New Rochelle, NY (US); Sri M. Sri-Jayantha, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 43 days.

(21) Appl. No.: 13/886,646

(22) Filed: May 3, 2013

(65) Prior Publication Data

US 2014/0329351 A1    Nov. 6, 2014

(51) Int. Cl.
*H01L 21/00* (2006.01)
*H01L 31/18* (2006.01)
*G01T 1/04* (2006.01)

(52) U.S. Cl.
CPC .. *H01L 31/18* (2013.01); *G01T 1/04* (2013.01)
USPC ............... 438/56; 250/336.1; 250/370.01; 250/390.01; 250/395; 250/472.1; 250/473.1; 250/474.1

(58) Field of Classification Search
CPC .......................................................... G01T 1/04
USPC ......... 250/472.1, 336.1, 370.01, 390.01, 395, 250/473.1, 474.1; 438/56
See application file for complete search history.

(56) References Cited

U.S. PATENT DOCUMENTS

| | | | | |
|---|---|---|---|---|
| 5,493,177 | A | * | 2/1996 | Muller et al. ................. 313/578 |
| 7,491,948 | B2 | | 2/2009 | Gordon et al. |
| 2009/0108212 | A1 | * | 4/2009 | Gordon et al. ................ 250/395 |

OTHER PUBLICATIONS

Gordon et al., "A Proposal for the Development of a Micro Geiger Counter," Aug. 8, 2011. 5 Unnumbered pages.

* cited by examiner

Primary Examiner — Bac Au
(74) Attorney, Agent, or Firm — Louis J. Percello

(57) ABSTRACT

A method for a constructing radiation detector includes fabricating a multi-layer structure upon a wafer, the multi-layer structure comprising a plurality of metal layers, a plurality of sacrificial layers, and a plurality of insulating layers, forming a cavity within the multi-layer structure, filling the cavity with a gas that ionizes in response to nuclear radiation, and sealing the gas within the cavity.

25 Claims, 12 Drawing Sheets

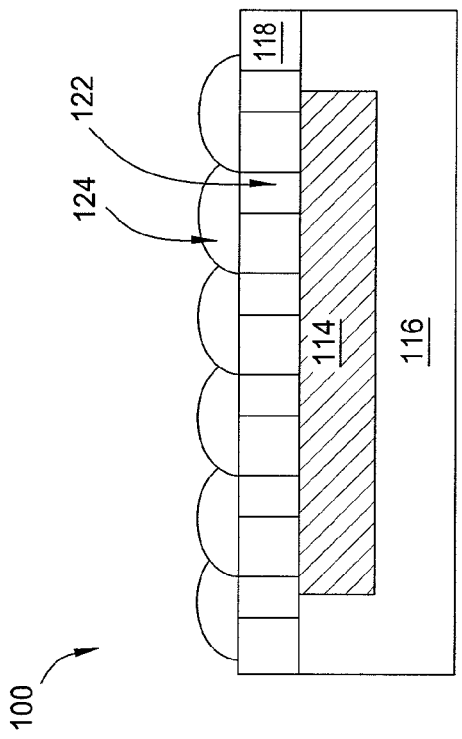
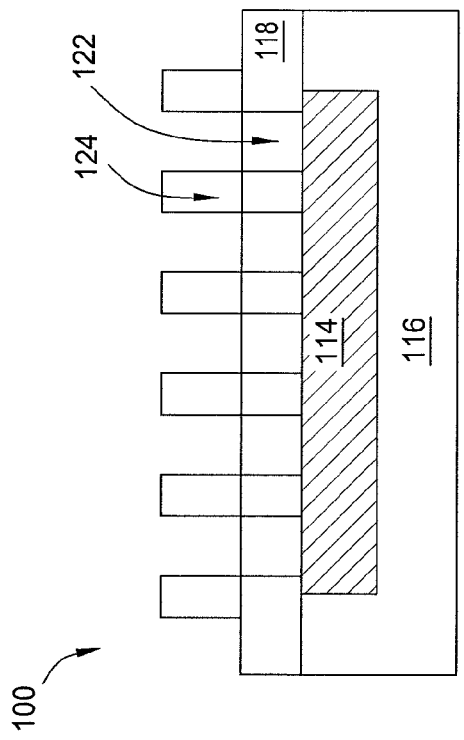
FIG. 3A
FIG. 3B

FABRICATING A SMALL-SCALE RADIATION DETECTOR

BACKGROUND OF THE INVENTION

The present invention relates generally to the detection of radiation and relates more specifically to devices for detecting the emission of ionizing radiation.

State of the art systems for detecting radiation typically rely on the use of relatively large (e.g., multiple centimeters in size) Geiger counters. These systems are often cumbersome and impractical for real-time tracking scenarios (e.g., situations in which location and nuclear radiation emissions associated with a specific person or article are monitored over time). Although smaller-scale Geiger counters have been proposed, it is difficult to seal the gas within these small Geiger counters during fabrication.

SUMMARY OF THE INVENTION

A method for constructing a radiation detector includes fabricating a multi-layer structure upon a wafer, the multi-layer structure comprising a plurality of metal layers, a plurality of sacrificial layers, and a plurality of insulating layers, forming a cavity within the multi-layer structure, filling the cavity with a gas that is ionized in response to nuclear radiation, and sealing the gas within the cavity.

Another method for fabricating a radiation detector includes depositing a first metal layer upon a wafer, depositing a first sacrificial layer upon the first metal layer, etching a portion of the first sacrificial layer down to the first metal layer, backfilling the portion of the first sacrificial layer with a first insulating layer, depositing a second metal layer upon the first sacrificial layer and the first insulating layer, patterning the second metal layer to form a first array of wires, backfilling the second metal layer with a second insulating layer after the patterning of the second metal layer, depositing a second sacrificial layer upon the second metal layer and the second insulating layer, etching a portion of the second sacrificial layer down to the second insulating layer, backfilling the portion of the second sacrificial layer with a third insulating layer, depositing a third metal layer upon the second sacrificial layer and the third insulating layer, patterning the third metal layer to form a second array of wires, backfilling the third metal layer with a fourth insulating layer after the patterning of the third metal layer, drilling a plurality of vias from the fourth insulating layer down to at least the second sacrificial layer, sacrificially etching the first sacrificial layer and the second sacrificial layer to create a cavity in place of the first sacrificial layer and the second sacrificial layer, filling the cavity with a gas that ionizes in response to nuclear radiation, using the plurality of vias, and encapsulating the plurality of vias to seal the gas within the cavity.

BRIEF DESCRIPTION OF THE DRAWINGS

So that the manner in which the above recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 3A-3B are schematic diagrams illustrating various stages of a second method for encapsulating the vias as illustrated in FIG. 1N, according to embodiments of the present invention;

DETAILED DESCRIPTION

In one embodiment, the invention is a small-scale radiation detector and method of fabrication. Embodiments of the invention fabricate a small radiation detector (e.g., a micro-Geiger counter) that detects the emission of nuclear radiation (e.g., alpha particles, beta particles, gamma rays) by the ionization produced in an inert, low-pressure gas (e.g., helium, neon, or argon with halogens added) in a sealed cavity (i.e., such that the gas does not flow). The gas is ionized by the passage of the ionizing radiation. A wire or series of wires in the cavity has the property of being able to amplify each ionization event by means of the Townsend avalanche effect and produces an easily measured current pulse which is passed to processing electronics. The amplitude of this pulse is typically relatively large (e.g., volt-scale) and is independent of the original number of ion pairs formed. The gas used to fill the tube is critical, as the radiation detector must be free of oxygen to properly function. A reduced electric field is also critical, so the pressure of the gas is typically less than one standard atmosphere.

In particular, embodiments of the invention fabricate the radiation detector using a combination of silicon process technologies and micro-electro-mechanical (MEM) processes, which addresses the problem of how to seal the low-pressure gas inside the small device. The radiation detector is small enough to embed in a driver's license, a mobile phone, or a similarly-sized item. When embedded in a device that includes a location sensor (e.g., a global positioning system sensor), one can obtain both a measure of the level of radiation emitted by the device and the device's location substantially simultaneously. This capability is especially helpful for first responders who might need to respond to an emergency situation involving radiation emission or exposure.

Figure 1B:
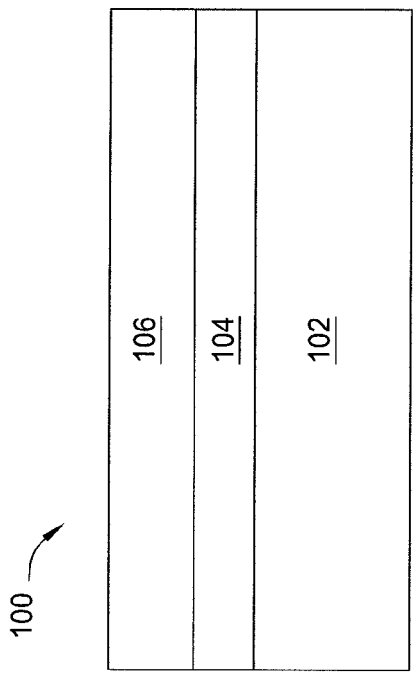
FIGS. 1A-1N are schematic diagrams illustrating various stages of fabrication of a radiation detector, according to embodiments of the present invention.
Figure 1A:
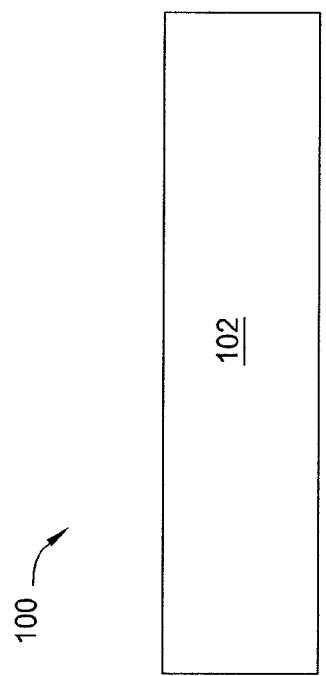
Figure 1D:
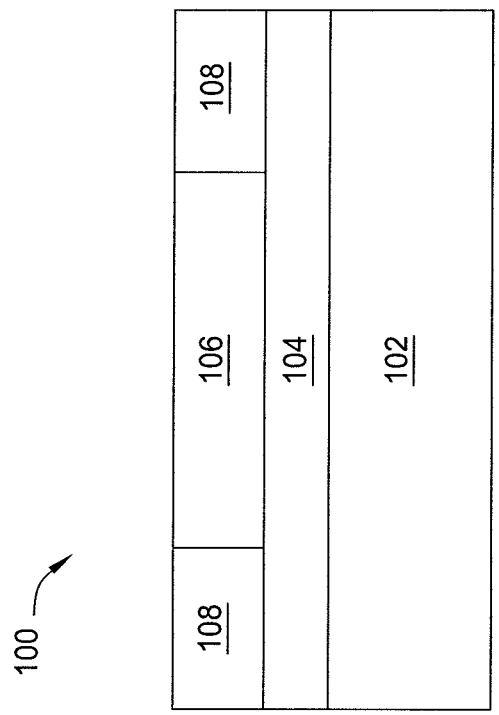
Figure 1C:
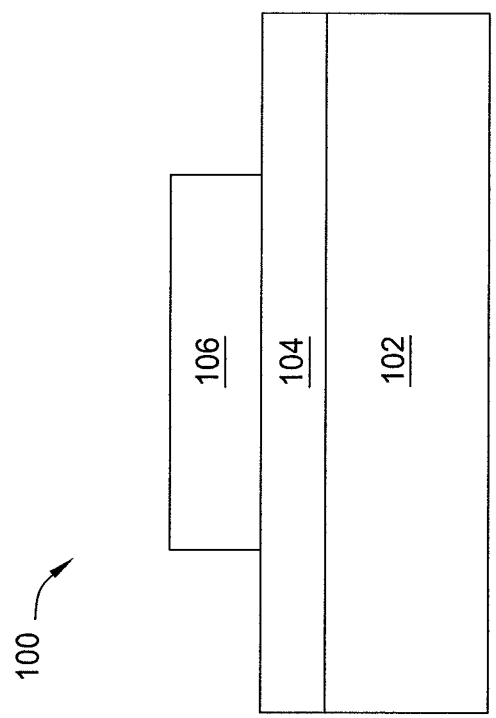
Figure 1F:
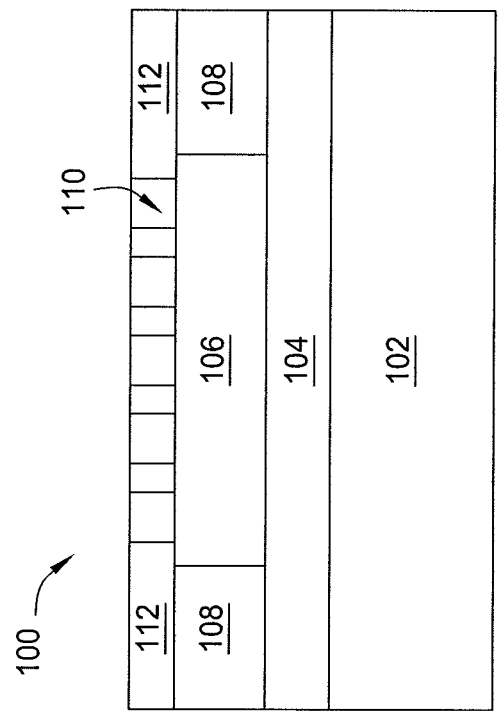
Figure 1E:
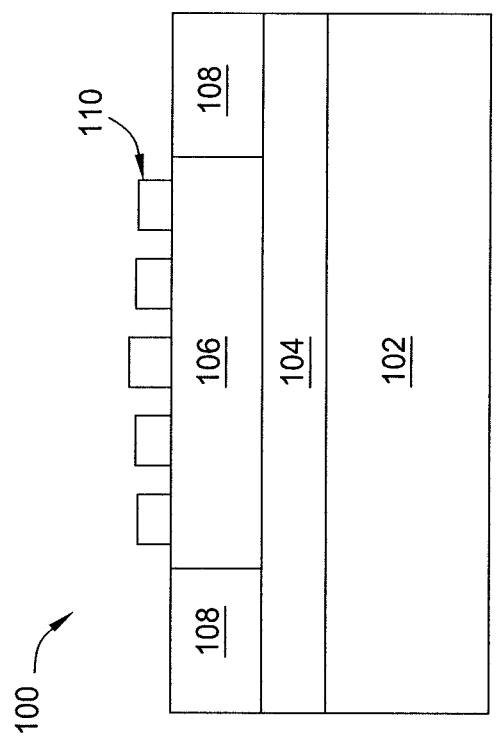
Figure 1H:
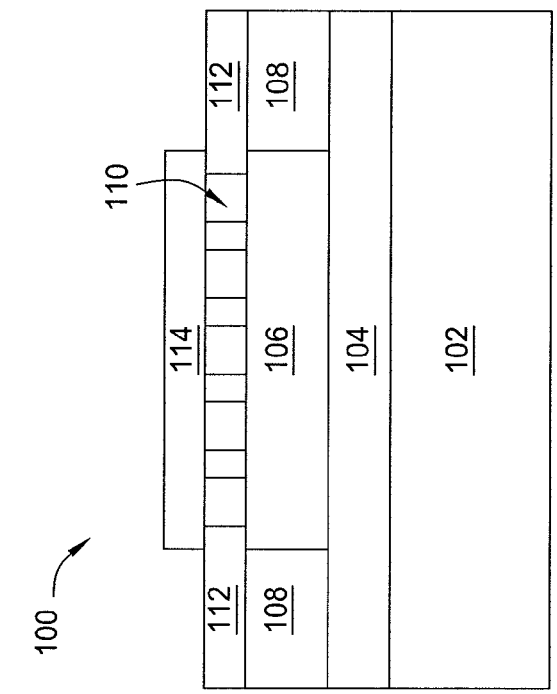
Figure 1G:
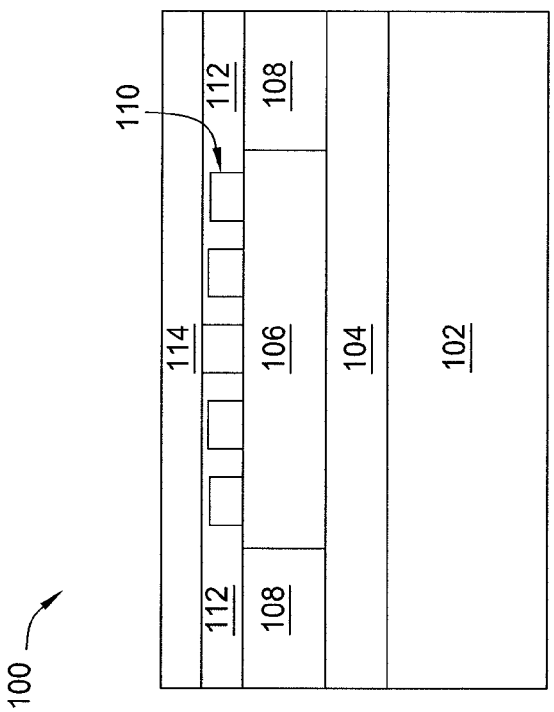
Figure 1J:
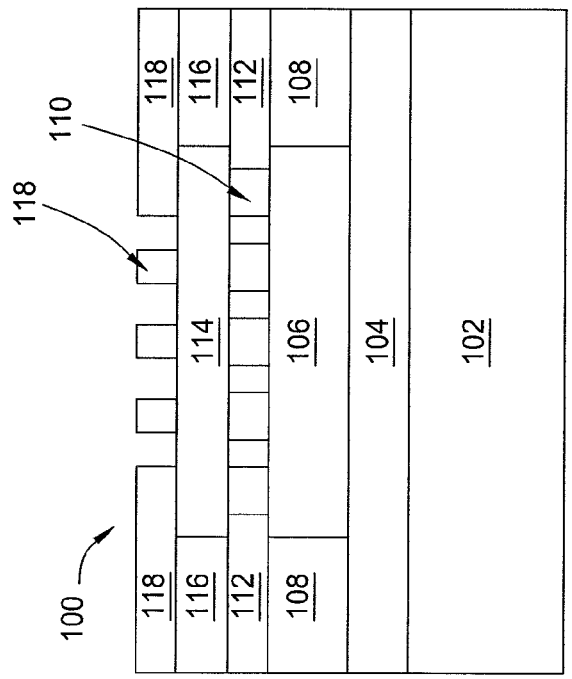
Figure 1I:
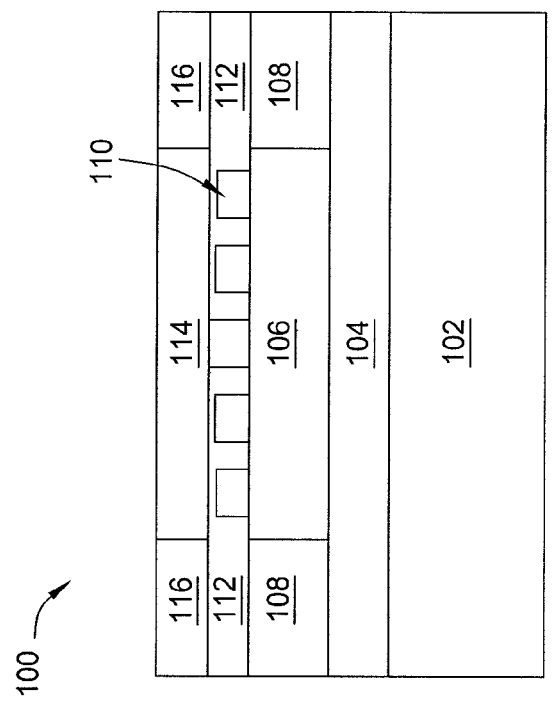
Figure 1L:
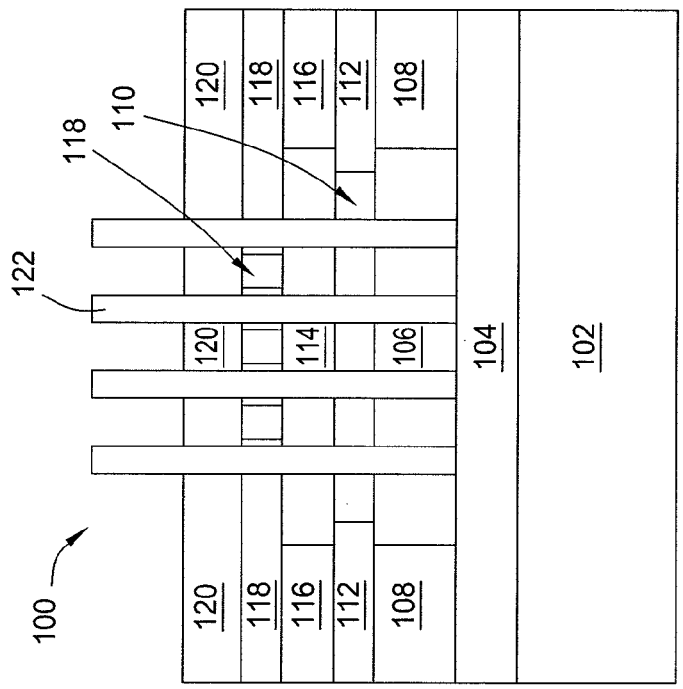
Figure 1K:
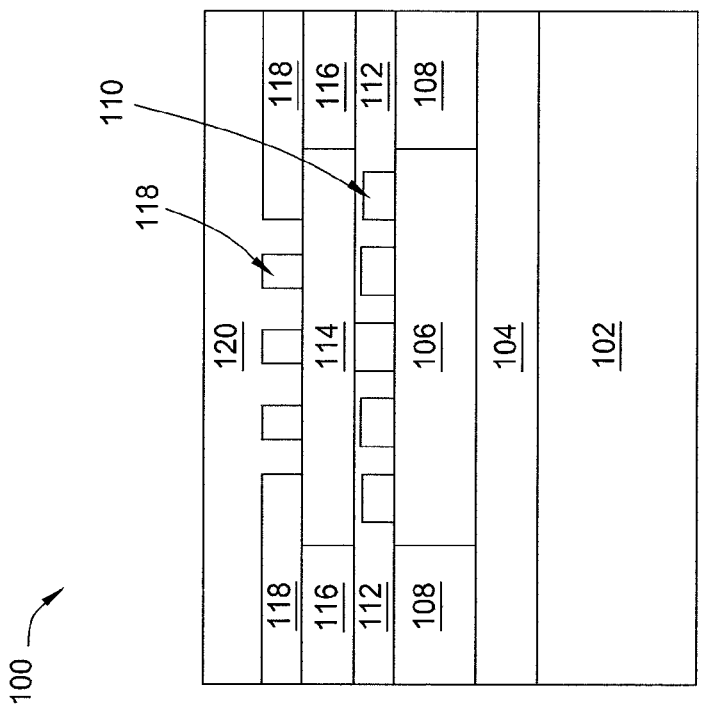
Figure 1N:
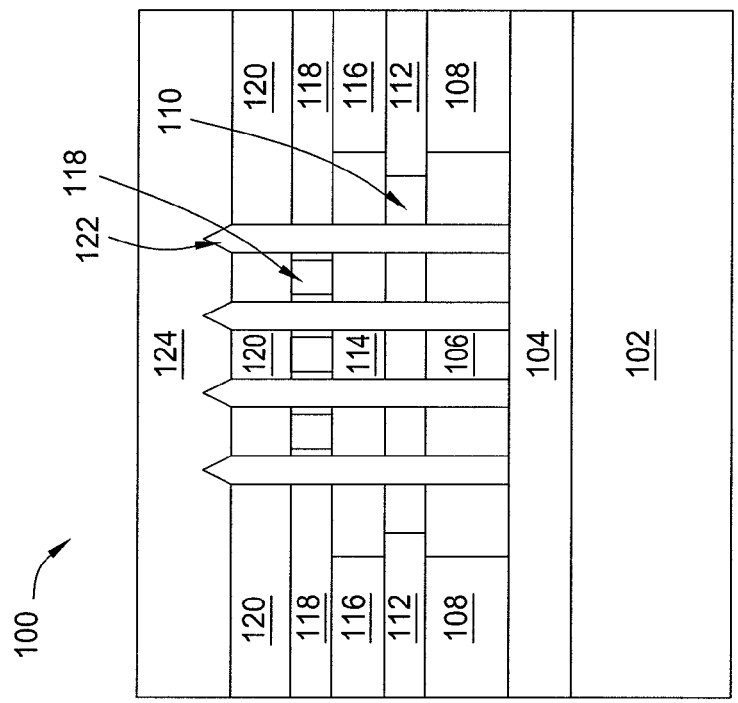

FIGS. 1A-1N are schematic diagrams illustrating various stages of fabrication of a radiation detector, according to embodiments of the present invention. As such, FIGS. 1A-1N also collectively serve as a flow diagram illustrating portions of one embodiment of a method for fabricating the radiation detector, according to the present invention. In particular, FIGS. 1A-1N illustrate the fabrication of a multi-layer structure 100 that may be used as a small-scale radiation detector.

As illustrated in FIG. 1A, in one embodiment, fabrication of the multi-layer structure 100 begins with a substrate 102. As discussed in further detail below, the wafer 102 will undergo various microfabrication process steps that collectively fabricate the multi-layer structure 100 upon the wafer 102. In one embodiment, the wafer 102 comprises silicon (Si) coated with a silicon oxide (SiOx) insulating film.

As illustrated in FIG. 1B, several layers of material are deposited on the wafer 102. In one embodiment, a first metal layer 104 is deposited on the wafer 102. The first metal layer 104 comprises a conductive metal and may be deposited by sputtering, evaporation, chemical vapor deposition (CVD), plasma-enhanced chemical vapor deposition (PECVD), or atomic layer deposition (ALD) directly onto the wafer 102. In an alternative embodiment, an adhesion layer and a barrier layer (comprising, for example, titanium (Ti) and titanium nitride (TiN), respectively) are deposited on the wafer 102 prior to deposition of the first metal layer 104 in order to prevent migration of the first metal layer 104. A first sacrificial layer 106 (comprising, for example, silicon, germanium, silicon germanide, or metals such as tungsten, molybdenum, tantalum, or tantalum nitride) is deposited directly over the first metal layer 104. In one embodiment, the first sacrificial layer 106 is sputtered onto the first metal layer 104 and has a thickness of approximately two micrometers.

As illustrated in FIG. 1C, a portion of the first sacrificial layer 106 is etched down to the first metal layer 104. In one embodiment etching of the first sacrificial layer 106 is performed using reactive ion etching. As illustrated in FIG. 1D, the first sacrificial layer 106 is next backfilled with a first insulating layer 108 (comprising, for example, silicon oxide). The first insulating layer 108 fills in the portion of the first sacrificial layer 106 that was etched in FIG. 1C. In one embodiment, backfill of the first sacrificial layer 106 is followed by a chemical mechanical planarization step.

As illustrated in FIG. 1E, a second metal layer 110 is deposited on the first sacrificial layer 106. The second metal layer 110 comprises a conductive metal and may be sputtered directly onto the first sacrificial layer 106. In an alternative embodiment, an adhesion layer and a barrier layer (comprising, for example, titanium (Ti) and titanium nitride (TiN), respectively) are deposited on the first sacrificial layer 106 prior to deposition of the second metal layer 110 in order to prevent migration of the second metal layer 110. The second metal layer 110 is patterned such that the remaining portions of the second metal layer 110 form a group of very small structures, which will become wires or interconnects in the radiation detector 100. The patterning of the second metal layer 110 may be performed using any one or more known techniques for patterning interconnects in an integrated circuit (e.g., transferring the pattern from one or more organic underlayers, photoresist layers, and/or mask layers using an etch process with an optical lithography technique).

As illustrated in FIG. 1F, the patterned second metal layer 110 is next backfilled with a second insulating layer 112 (comprising, for example, silicon oxide). The second insulating layer 112 fills in the portions of the second metal layer 110 that were removed in FIG. 1E during pattern transfer. In one embodiment, backfill of the second metal layer 110 is followed by a chemical mechanical planarization step and/or a reactive ion etch step to expose silicon.

As illustrated in FIG. 1G, a second sacrificial layer 114 (comprising, for example, silicon) is deposited directly over the backfilled second metal layer 110. In one embodiment, the second sacrificial layer 114 is sputtered onto the second metal layer 110 and has a thickness of approximately two micrometers. As illustrated in FIG. 1H, a portion of the second sacrificial layer 114 is etched down to the second insulating layer 112. In one embodiment etching of the second sacrificial layer 114 is performed using reactive ion etching. As illustrated in FIG. 1I, the second sacrificial layer 114 is next backfilled with a third insulating layer 116 (comprising, for example, silicon oxide). The third insulating layer 116 fills in the portions of the second sacrificial layer 114 that were removed in FIG. 1H during etching. In one embodiment, backfill of the second sacrificial layer 114 is followed by a chemical mechanical planarization step.

As illustrated in FIG. 1J, a third metal layer 118 is deposited on the first backfilled second sacrificial layer 114. The third metal layer 118 comprises a conductive metal and may be sputtered directly onto the backfilled second sacrificial layer 114. In an alternative embodiment, an adhesion layer and a barrier layer (comprising, for example, titanium (Ti) and titanium nitride (TiN), respectively) are deposited on the backfilled second sacrificial layer 114 prior to deposition of the third metal layer 118 in order to prevent migration of the third metal layer 118. The third metal layer 118 is patterned such that the remaining portions of the third metal layer 118 form a group of very small structures, which will become wires or interconnects in the radiation detector 100. The patterning of the third metal layer 118 may be performed using any one or more known techniques for patterning interconnects in an integrated circuit (e.g., transferring the pattern from one or more organic underlayers, photoresist layers, and/or mask layers using an etch process with an optical lithography technique).

As illustrated in FIG. 1K, the patterned third metal layer 118 is next backfilled with a fourth insulating layer 120 (comprising, for example, silicon oxide). The fourth insulating layer 120 fills in the portions of the third metal layer 118 that were removed in FIG. 1J during pattern transfer and also leaves a layer of insulating material over the remaining portions of the third metal layer 118. In one embodiment, backfill of the third metal layer 118 is followed by a chemical mechanical planarization step.

As illustrated in FIG. 1L, several small vias or cavities 122 are drilled through the structure from the fourth insulating layer 120 down to the first metal layer 104. Alternatively, the cavities 122 may be drilled down only to the second sacrificial layer 114.

Figure 1M:
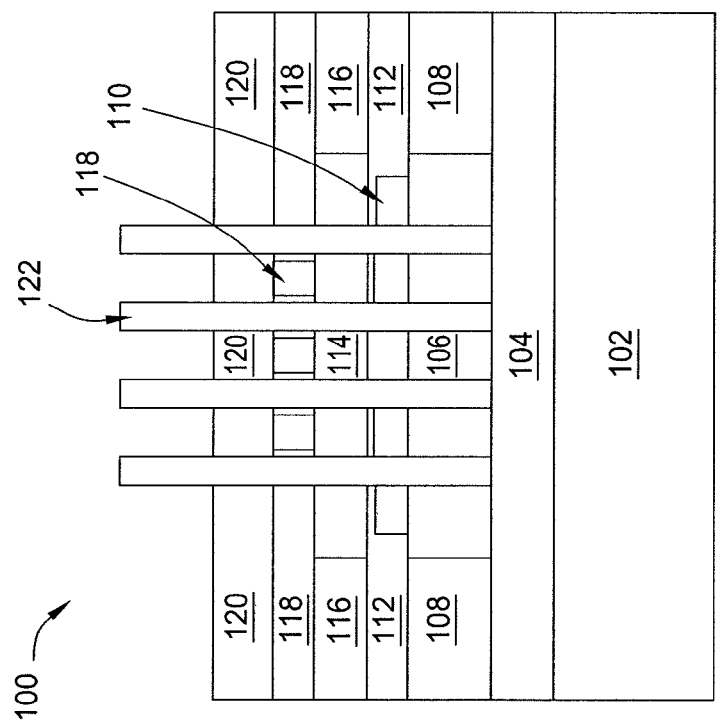

As illustrated in FIG. 1M, a sacrificial etch of the first sacrificial layer 106 and the second sacrificial layer 114 is next performed. In one embodiment, the sacrificial etch uses xenon difluoride gas to remove the sacrificial material through the cavities 122. However, in other embodiments, other etch techniques (such as ashing of an organic sacrificial layer, solvent removal of a soluble organic sacrificial layer, or the like) can be used. The sacrificial etch results in a cavity being formed in place of the first sacrificial layer 106 and the second sacrificial layer 114.

As illustrated in FIG. 1N, after the sacrificial etch, the cavities 122 are filled with an inert, low-pressure gas (e.g., helium, neon, or argon with halogens added), which is sealed in by encapsulating the cavities 122 with an encapsulating layer 124. Various methods for encapsulating the cavities are discussed in greater detail with respect to FIGS. 2A-2D and FIGS. 3A-3B.

The process illustrated in FIGS. 1A-1N thus fabricates a small scale radiation detector using a sequence of metal insulating and sacrificial deposition and patterning steps, followed by a final selective removal of sacrificial materials to form a cavity structure. The illustrated process may be used to fabricate a structure that includes multiple cavities (e.g., arranged side-by-side) for holding the inert, low-pressure gas. The thickness of each cavity's outer walls can be varied to improve the sensitivity of the detector to incident alpha particles. Boron could be added to the outer wall to increase the sensitivity of the detector to incident neutrons.

Patterning of the second metal layer 110 and the third metal layer 118 is performed such that the resultant array of very small structures (which will become the wires or interconnects of the radiation detector 100) are interdigitated and spaced in a manner that permits the use of the multi-layer structure 100 as an in-situ Pirani gauge (i.e., a thermal conductivity gauge used for the measurement of the pressures in vacuum systems). In this case, one wire of the array is isolated for resistance measurement (i.e., pressure), while the remaining wires are arranged in parallel for increasing the signal-to-noise ratio (SNR) of the radiation detector. Moreover, any of the patterned metal layers (i.e., second metal layer 110 and the third metal layer 118) may incorporate a protective wire coating to prevent oxidation or modification of the patterns during any subsequent gas processing steps.

FIGS. 2A-2D are schematic diagrams illustrating various stages of a first method for encapsulating the cavities 122 as illustrated in FIG. 1N, according to embodiments of the present invention. As such, reference is made in the discussion of FIGS. 2A-2D to various elements of the radiation detector structure illustrated in FIGS. 1A-1N (though the illustration in FIGS. 2A-2D is simplified relative to FIGS. 1A-1N for ease of illustration); however, it will be appreciated that the method illustrated in FIGS. 2A-2D could be used to encapsulate cavities formed using other processes.

Figure 2B:
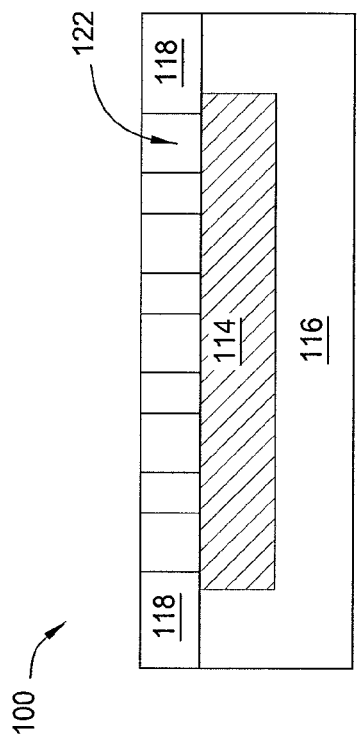
FIGS. 2A-2D are schematic diagrams illustrating various stages of a first method for encapsulating the vias as illustrated in FIG. 1N, according to embodiments of the present invention.
Figure 2A:
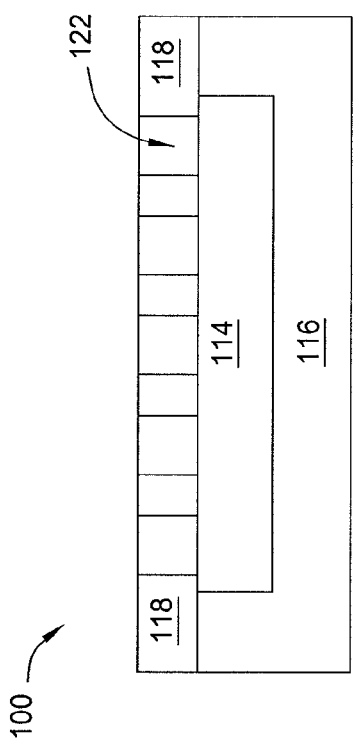

In particular, FIGS. 2A-2D illustrate a method of encapsulating cavities using a plasma-enhanced chemical vapor deposition (PECVD) process. As illustrated in FIG. 2A, the process begins shortly after the cavities 122 are drilled through the various layers (e.g., similar to FIG. 1L). As illustrated in FIG. 2B, a sacrificial etch of at least the second sacrificial layer 114 is next performed, such that the sacrificial material in the second sacrificial layer 114 is removed through the cavities 122 (e.g., similar to FIG. 1M).

Figure 2D:
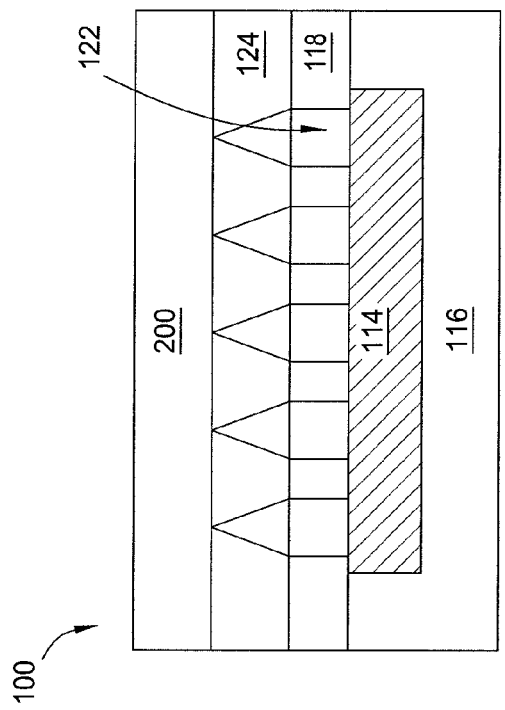
Figure 2C:
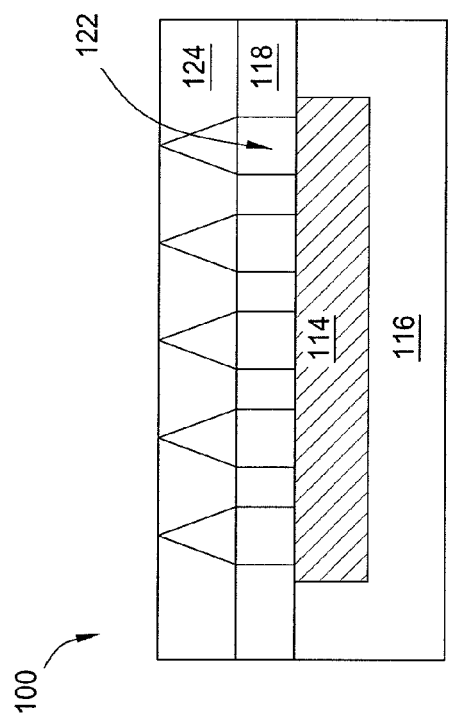

As illustrated in FIG. 2C, the cavities 122 are filled with an inert, low-pressure gas and at least partially encapsulated with the encapsulating layer 124. In one embodiment, the encapsulating layer 124 is applied using a plasma-enhanced chemical vapor deposition process that leaves the tips of the cavities 122 unsealed. As illustrated in FIG. 2D, the cavities 122 are sealed completely by applying at least one additional encapsulating layer 200. In one embodiment, the additional encapsulating layer(s) is applied used a plasma-enhanced chemical vapor deposition process, a sub-atmospheric chemical vapor deposition process, and/or a physical vapor deposition process.

The technique illustrated in FIGS. 2A-2D exploits the non-conformal plasma-enhanced chemical vapor deposition process to at least partially seal or encapsulate the cavities 122 that are used for extracting the sacrificial material (e.g., second sacrificial layer 114) in micro-electro-mechanical processing. A combination of processes can be used to seal the inert, low-pressure gas into the cavities 122 given the pressure and type of gas. Any of these processes may additionally employ a step of doping the inert, low-pressure gas (e.g., boron, phosphorous, chlorine, fluorine, or other gases).

FIGS. 3A-3B are schematic diagrams illustrating various stages of a second method for encapsulating the cavities 122 as illustrated in FIG. 1N, according to embodiments of the present invention. As such, reference is made in the discussion of FIGS. 3A-3B to various elements of the radiation detector structure illustrated in FIGS. 1A-1N (though the illustration in FIGS. 3A-3B is simplified relative to FIGS. 1A-1N for ease of illustration); however, it will be appreciated that the method illustrated in FIGS. 3A-3B could be used to encapsulate cavities formed using other processes.

In particular, FIGS. 3A-3B illustrate a method of encapsulating cavities using a solder reflow process. As illustrated in FIG. 3A, the process begins shortly after the sacrificial material in the second sacrificial layer 114 is removed through the cavities 122 (e.g., similar to FIG. 1M). The encapsulating layer 124 is applied in the form of solder pillars. In one embodiment, one solder pillar is placed between each pair of cavities 122.

As illustrated in FIG. 3B, the cavities 122 are filled with the inert, low-pressure gas, and the solder pillars are reflowed in inert ambient conditions to seal the cavities 122 and create the encapsulating layer 124. Encapsulation by solder reflow allows the cavities 122 to be sealed at a greater range of sealing pressures than the plasma-enhanced chemical vapor deposition process illustrated in FIGS. 2A-2D. Precise doping of the inert, low-pressure gas (e.g., with a halogen) may also be easier to achieve when encapsulating by solder reflow.

There are also multiple ways in which the patterned metal layers (e.g., second metal layer 110 and third metal layer 118) may be processed to form round wires or interconnects. These wires may be formed as single-layer wires (e.g., including long, thin wires with wide supports to the wires prevent sagging). The wires may also be used to detect acceleration forces (which might produce spurious signals) and to shut down the radiation detector, if necessary.

Figure 4A:
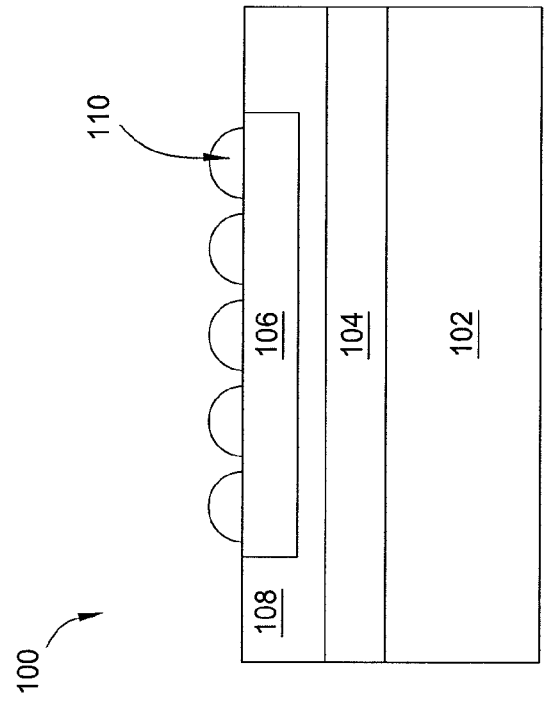
FIGS. 4A-4B are schematic diagrams illustrating various stages of a first method for fabricating round wires, according to embodiments of the present invention.
Figure 4B:
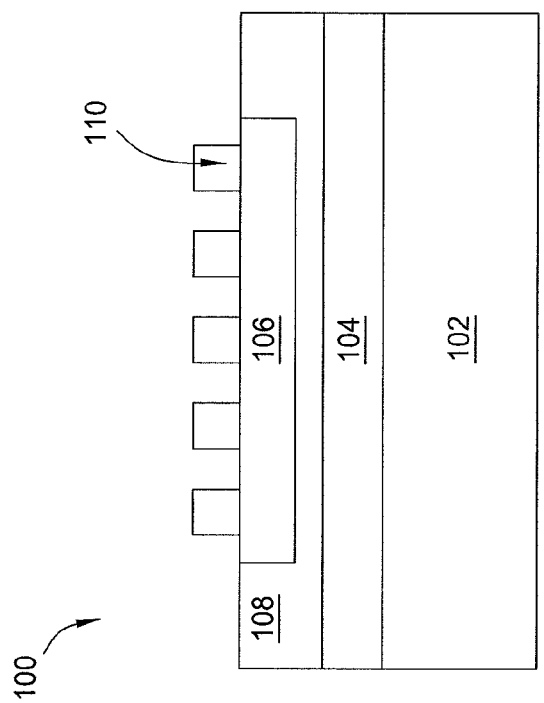

FIGS. 4A-4B, for example, are schematic diagrams illustrating various stages of a first method for fabricating round wires, according to embodiments of the present invention. In particular, FIGS. 4A-4B illustrate a method of forming round wires using thermal annealing.

As illustrated in FIG. 4A, the process begins after the second metal layer 110 has been patterned (e.g., as illustrated and described in connection with FIG. 1E). As illustrated in FIG. 4B, a thermal annealing process is used to round the shape of the very small structures that are patterned into the second metal layer 110.

Figure 5B:
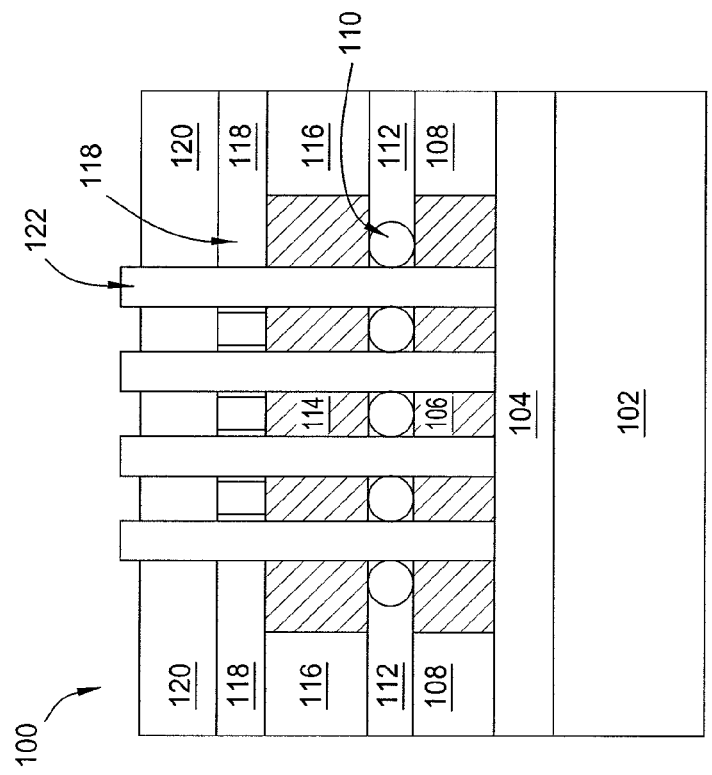
FIGS. 5A-5B are schematic diagrams illustrating various stages of a second method for fabricating round wires, according to embodiments of the present invention.
Figure 5A:
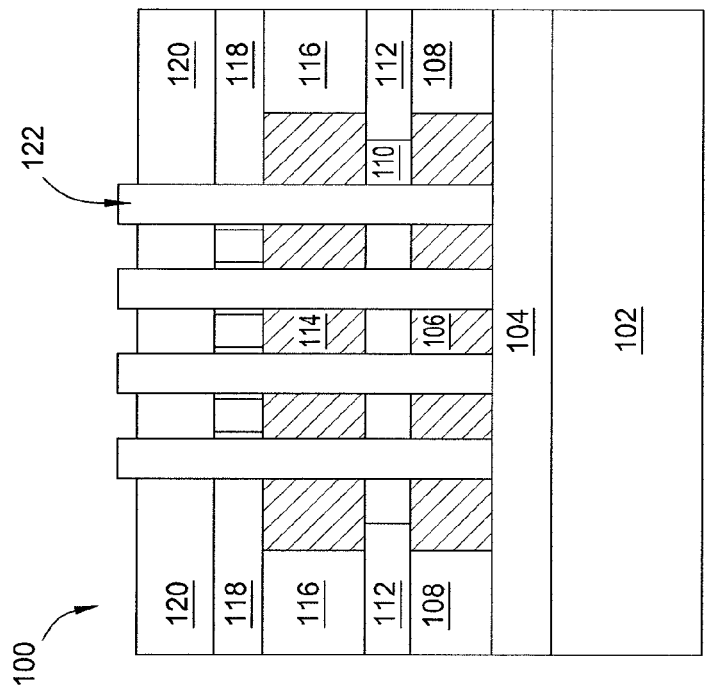

FIGS. 5A-5B are schematic diagrams illustrating various stages of a second method for fabricating round wires, according to embodiments of the present invention. In particular, FIGS. 5A-5B illustrate a method of forming round wires using diatomic chlorine exposure.

As illustrated in FIG. 5A, the process begins after the third metal layer 118 has been patterned and the first sacrificial layer 106 and second sacrificial layer 114 have been sacrificially etched (e.g., as illustrated and described in connection with FIG. 1M). As illustrated in FIG. 5B, the second metal layer 110 and the third metal layer 118 can be exposed to diatomic chlorine gas ($Cl_2$) to round the shape of the very small structures patterned therein via spontaneous etch.

In further embodiments, the corners of the wires may be rounded by generating an electric field breakdown that cleans and rounds the wires substantially simultaneously. This approach also minimizes contamination during fabrication of the multi-layer structure 100.

While the foregoing is directed to embodiments of the present invention, other and further embodiments of the invention may be devised without departing from the basic scope thereof Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. A method for constructing a radiation detector, the method comprising:
fabricating a multi-layer structure upon a wafer, the multi-layer structure comprising a plurality of metal layers, a plurality of sacrificial layers, and a plurality of insulating layers, wherein the multi-layer structure comprises:
a first metal layer deposited upon the wafer;

a first sacrificial layer deposited upon the first metal layer;
a second metal layer deposited upon the first sacrificial layer;
a second sacrificial layer deposited upon the second metal layer; and
a third metal layer deposited upon the second sacrificial layer;
forming a cavity within the multi-layer structure;
filling the cavity with a gas that ionizes in response to nuclear radiation; and
sealing the gas within the cavity.

2. The method of claim 1, wherein the cavity is formed within the first sacrificial layer and the second sacrificial layer.

3. The method of claim 2, wherein the forming comprises:
drilling a plurality of vias through at least some of the plurality of insulating layers; and
removing material from the first sacrificial layer and the second sacrificial layer through the plurality of vias.

4. The method of claim 3, wherein the removing is performed using a sacrificial etch process.

5. The method of claim 4, wherein the sacrificial etch process uses xenon difluoride to etch the first sacrificial layer and the second sacrificial layer.

6. The method of claim 1, wherein the fabricating comprises a combination of silicon process technologies and micro-electro-mechanical processes.

7. The method of claim 1, further comprising:
patterning at least one of the plurality of metal layers into an array of wires.

8. The method of claim 7, wherein the array of wires comprises a plurality of wires arranged in an interdigitated manner.

9. The method of claim 8, wherein the plurality of wires comprises:
a set of wires arranged in parallel; and
one wire isolated from the set of wires.

10. The method of claim 7, wherein the patterning comprises:
rounding a shape of wires in the array of wires.

11. The method of claim 10, wherein the rounding is accomplished using a thermal annealing process.

12. The method of claim 10, wherein the rounding is accomplished using a spontaneous etch process.

13. The method of claim 12, wherein the spontaneous etch process uses diatomic chlorine gas.

14. The method of claim 10, wherein the rounding is accomplished by generating an electric field breakdown.

15. The method of claim 1, wherein the sealing comprises:
encapsulating a plurality of vias drilled through the multi-layer structure and used to provide the gas to the cavity.

16. The method of claim 15, wherein the encapsulating comprises:
depositing a first encapsulating layer over the plurality of vias, wherein the first encapsulating layer leaves tips of the plurality of vias open; and
depositing a second encapsulating layer over the first encapsulating layer, wherein the second encapsulating layer covers the tips.

17. The method of claim 16, wherein the first encapsulating layer is deposited using a plasma-enhanced chemical vapor deposition process.

18. The method of claim 16, wherein the second encapsulating layer is deposited using a plasma-enhanced chemical vapor deposition process.

19. The method of claim 16, wherein the second encapsulating layer is deposited using a sub-atmospheric chemical vapor deposition process.

20. The method of claim 16, wherein the second encapsulating layer is deposited using a physical vapor deposition process.

21. The method of claim 15, wherein the encapsulating comprises:
depositing a plurality of solder pillars on the multilayer structure; and
reflowing the solder pillars to cover the plurality of vias.

22. A method for fabricating a radiation detector, the method comprising:
depositing a first metal layer upon a wafer;
depositing a first sacrificial layer upon the first metal layer;
etching a portion of the first sacrificial layer down to the first metal layer;
backfilling the portion of the first sacrificial layer with a first insulating layer;
depositing a second metal layer upon the first sacrificial layer and the first insulating layer;
patterning the second metal layer to form a first array of wires;
backfilling the second metal layer with a second insulating layer after the patterning of the second metal layer;
depositing a second sacrificial layer upon the second metal layer and the second insulating layer;
etching a portion of the second sacrificial layer down to the second insulating layer;
backfilling the portion of the second sacrificial layer with a third insulating layer;
depositing a third metal layer upon the second sacrificial layer and the third insulating layer;
patterning the third metal layer to form a second array of wires;
backfilling the third metal layer with a fourth insulating layer after the patterning of the third metal layer;
drilling a plurality of vias from the fourth insulating layer down to at least the second sacrificial layer;
sacrificially etching the first sacrificial layer and the second sacrificial layer to create a cavity in place of the first sacrificial layer and the second sacrificial layer;
filling the cavity with a gas that ionizes in response to nuclear radiation, using the plurality of vias; and
encapsulating the plurality of vias to seal the gas within the cavity.

23. The method of claim 22, wherein the sacrificially etching comprises:
removing sacrificial material from the first sacrificial layer and the second sacrificial layer through the plurality of vias.

24. The method of claim 22, wherein at least one of the patterning the second metal layer or the patterning the third metal layer comprises:
rounding the first array of wires or the second array of wires.

25. A method for constructing a radiation detector, the method comprising:
fabricating a multi-layer structure upon a wafer, the multi-layer structure comprising a plurality of metal layers, a plurality of sacrificial layers, and a plurality of insulating layers;
forming a cavity within the multi-layer structure;
filling the cavity with a gas that ionizes in response to nuclear radiation; and sealing the gas within the cavity, wherein the sealing comprises encapsulating a plurality of vias drilled through the multilayer structure and used to provide the gas to the cavity.

* * * * *